United States Patent [19]

Alais

[11] 3,945,854
[45] Mar. 23, 1976

[54] LONG-LIFE THERMOELECTRIC GENERATOR

[75] Inventor: Michel Alais, Orsay, France

[73] Assignee: Compagnie Industrielle des Telecommunications Cit-Alcatel, France

[22] Filed: Jan. 22, 1973

[21] Appl. No.: 325,351

[30] Foreign Application Priority Data
Jan. 20, 1972 France .............................. 72.01828

[52] U.S. Cl. ................ 136/202; 136/211; 136/212; 136/223; 136/224
[51] Int. Cl.² .......................................... H01L 37/00
[58] Field of Search ........... 136/202, 211, 212, 223, 136/224, 238

[56] References Cited
UNITED STATES PATENTS

| | | | |
|---|---|---|---|
| 3,413,156 | 11/1968 | Campana | 136/212 |
| 3,524,773 | 8/1970 | Cermak | 136/233 X |
| 3,551,212 | 12/1970 | Freund et al. | 136/202 |
| 3,600,585 | 8/1971 | Kelly et al. | 136/202 X |
| 3,607,443 | 9/1971 | Purdy | 136/202 |
| 3,626,583 | 12/1971 | Abbott et al. | 136/211 X |
| 3,666,566 | 5/1972 | Paine | 136/202 |
| 3,728,160 | 4/1973 | Des Champs et al. | 136/202 |
| 3,758,346 | 9/1973 | Falkenberg et al. | 136/202 |

FOREIGN PATENTS OR APPLICATIONS

| | | | |
|---|---|---|---|
| 7,001,105 | 8/1970 | Netherlands | 136/202 |
| 199,222 | 1/1968 | U.S.S.R. | 136/202 |

OTHER PUBLICATIONS

Alcatel, "Alcatel Thermoelectric Microgenerators," 4 pages, Alcatel (1970) Paris.
U.S. AEC, "High-Temperature Radioisotope Thermoelectric Generator for Space Applications," Report TID–22350, pp. 61–63, US AEC (1964) Oak Ridge, Tenn.

*Primary Examiner*—Benjamin R. Padgett
*Assistant Examiner*—E. A. Miller
*Attorney, Agent, or Firm*—Craig & Antonelli

[57] ABSTRACT

Thermoelectric long-lasting microgenerator which may be implanted in the human body, using a cylinder containing a radioactive isotope as a heat source and the human body as a cold source. The connection between the heat source and the thermoelectric element is effected by means of a supple substance which is a poor conductor of electricity. The rest of the heat source is surrounded by a volume affording a very high impedance to the propagation of heat.

21 Claims, 1 Drawing Figure

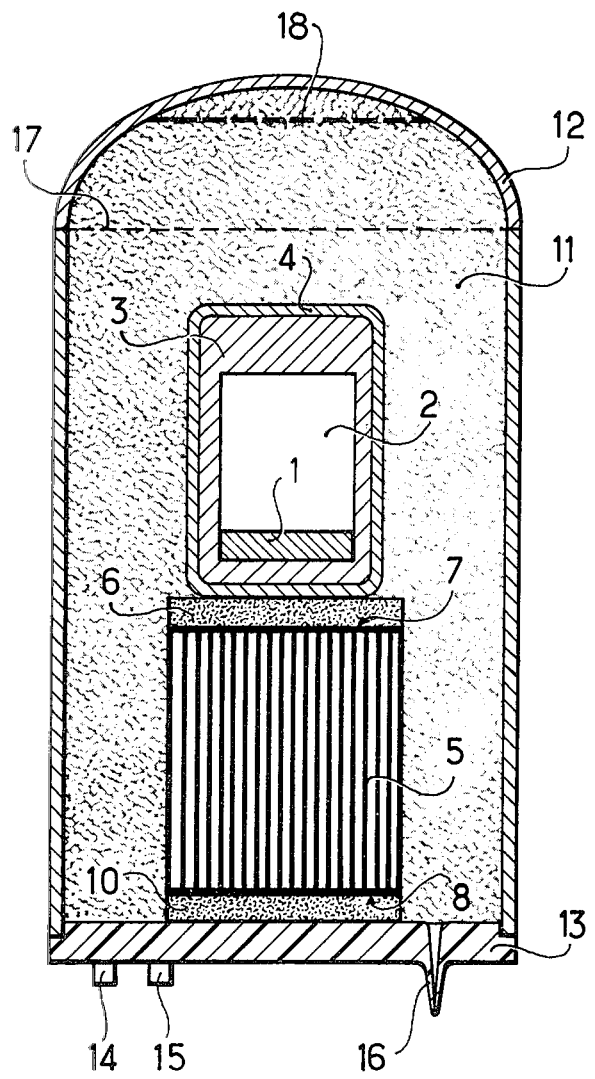

LONG-LIFE THERMOELECTRIC GENERATOR

The present invention concerns the structure of a thermoelectric generator having very small dimensions drawing heat energy from a radioactive source constituted by a radio-isotope such as plutonium 238.

The structure of the thermoelectric microgenerators intended to be implanted in the human body to stimulate the operation of an organ, or else to be substituted for the latter must fulfill a certain number of particularly severe conditions.

It must, more particularly, have an effective operational life which is not less than about 10 years, in order to avoid repeated surgical operations. During that period, the radioactive source must transmit to the organ only a perfectly tolerable quantity of ionizing radiations. The operation of the generator must remain particularly sure and reliable whatever incidents the body bearing the device may be subjected to; more particularly, the microgenerator must be able to be subjected for a short instant to a high acceleration very much greater than twice the acceleration of gravity, of the kind encountered in a car accident or aeroplane crash. Likewise, the microgenerator must remain fluid-tight even if the person bearing the device were burned in a fire.

The heat losses of the microgenerator must be sufficiently low and the output of that microgenerator must be as high as possible, in order to reduce to a minimum, the volume and the mass of the radioactive source.

The first of the above conditions determine the choice of the radioactive isotope which is to be used as a source for the microgenerator. It is known that plutonium 238 emits a very slight alpha radiation, the main radiation being absorbed by the plutonium itself. The residual alpha radiation is easily absorbed by a metallic casing a few millimeters thick, the half-period of plutonium 238 being in the order of 90 years, that substance is suitable for selection to constitute the energy source of the microgenerator. The energy source is therefore constituted by a plutonium 238 pellet placed in an empty space confined by a fluid-tight metal wall whose outer casing is formed by platinum. Such an empty volume is indispensable for safety reasons. Indeed, the total alpha radiation comprising the main radiation absorbed by the plutonium itself and the residual radiation emitted outwards give rise to a certain quantity of helium which remains at a normal temperature absorbed within the plutonium. If, for an outside accidental cause, the temperature of the microgenerator were to rise, and this would more particularly be the case, should the bearer of that generator be burned in a fire, the helium would be set free and would take up the empty space provided for that purpose without any danger of explosion which might be liable to cause an accidental releasing of the plutonium in the source.

The last two conditions set forth above concern heat losses and the improvement of the output. Now, in that thermoelectric microgenerator, the heat is formed by the casing of the plutonium 238 pellet, whereas the cold source is formed by the outer casing of the microgenerator. The output will therefore be improved by draining the maximum of the heat flux emitted by the heat source towards the thermoelectric converter and by preventing the heat from propagating in all parasite directions. The nature of the thermoelectric element also plays a very important part. More particularly, an element constituted by metallic thermocouples would make it possible to produce a solid thermoelement easily bearing high accelerations, but it has a fairly low output. Consequently, if a metallic thermoelement were used, it would be necessary to combine it with a relatively great source of radioactive energy requiring, in its turn, a fairly heavy protection against ionizing radiations. Moreover, heat losses would become prohibitive and the device thus designed would be difficult to implant in the human body. One of the merits of the applicant has been that he has implemented thermoelements basically consisting of highly doped semiconductors which are hence insensitive to the ionizing action of the radioactive source and have, furthermore, a merit factor eight to 10 times greater than that of the best metallic thermoelectric couples. Thus, the output is improved while heat losses are reduced.

The energy converter implemented by the applicant is a thermoelectric device consisting of a certain quantity of thermocouples (which is never less than 50) connected together in series. These thermocouples consist of P and N semiconductor elements in whose composition bismuth telluride is often included as one of the components of a solid solution without forasmuch its use being compulsory; various other compositions well known to the man in the art have been used with success.

The nature of the energy converter having been specified, it appeared necessary to produce, on either side of the thermoelement, a simultaneous resilient and thermal connection with the heat source and with the cold source, so that semiconductive thermoelement may bear, without damage, very high accelerations while continuing to maintain a close thermal connection with the heat source and the cold source, so that the aim which the applicant has set himself is to produce a microgenerator having a high output energy converter having an excellent mechanical connection but with low heat resistance simultaneously with the heat source and with the cold source.

The object of the invention is therefore a very long-lasting thermoelectric generator consisting of:

An outer casing acting as a cold source and containing the microgenerator;

A hot source formed by a fluid-tight heat conducting metallic casing containing, in the vicinity of one of its walls, a radioactive source;

A thermoelectric generator having a high output, mechanically connected to the heat source and to the cold source;

A highly insulating medium filling up the rest of the space confined by the outer casing;

characterized in that on the one hand, the thermoelectric generator consists of P and N semiconductive elements, connected up in series, and in that on the other hand, the means for connecting the said thermoelectric generator with the hot source and with the cold source is resilient and has a low heat resistance in relation to the heat resistance of the highly insulating medium confined by the external casing.

Indeed, only the simultaneous implementing of a thermoelectric generator basically consisting of semiconductor elements having high output and good mechanical and thermal connection with the sources enables the producing of a device which may be implanted in the human body and meeting the requirements set forth above.

It will be understood that the connection element between the thermocouple and the heat source must have, simultaneously, good elasticity for withstanding accelerations to which the microgenerator may be subjected and satisfactory heat conductivity to supply the thermocouple with heat energy. If one of these conditions is not fulfilled, and, for example, the connecting means is brittle, it ceases to be reliable and the advantages of the microgenerator are all lost. The same applies if the heat released by the source only partly reaches the thermocouple, that is, if the heat resistance offered by the insulating medium filling the outer casing is in the same order of magnitude as the resistance of the connection means. It is therefore observed that this last resistance must be clearly lower than that offered by the insulating medium filling the casing. Nevertheless, the connecting means must not forasmuch be a good conductor of electricity, for then, a parasite current would be set up between the various elements of the thermocouple placed in series. These various contradictory conditions have led the applicant to use a substance which is a poor conductor of electricity, a rather average heat conductor, but used in slight thickness to set up that connection, and to surround simultaneously the rest of the heat source with a heat barrier having a very high resistance so as to canalize the heat flux just the same towards the lowest resistances. Moreover, by increasing the barrier against the propagation of the heat flux in parasite directions, it should not be considered satisfactory only to improve the output of the microgenerator but the quantity of the radioactive product required and consequently the ionizing radiation and the hindrance it would be liable to cause to the organs near which it has been implanted is decreased by as much.

The invention is described in greater detail in the following description with reference to the single FIGURE showing a diagrammatic cross-section of one of the microgenerators produced by the applicant.

That single FIGURE shows, at 1, the radioactive source formed by a pellet of plutonium 238. The disintegration of that radioactive isotope causes helium which is liable to fill the cavity 2 if the temperature of the plutonium rises substantially. That enclosure is confined by a cylindrical covering of tantalum 3 having very good mechanical qualities at high temperature and by a platinum cylinder 4. The cylindrical platinum covering 4 ensures good protection against oxidization. Moreover, the two coverings completely absorb the alpha radiation and allow only gamma radiation and neutron radiation coming mainly from impurities in the plutonium and sufficiently slight not to have any appreciable nocivity to emerge. The cylindrical platinum covering is a good conductor of heat. The outer surface of that cylinder constitutes the heat source. The outer upper face and the outer lateral face of the platinum cylinder are minutely polished in order to reduce the heat radiation of the heat source in parasite directions. The heat from the heat source is transmitted to the block of thermoelectric cells 5 through a connection means 6 formed by a layer of resilient resin basically consisting of silicone substances, so that the side 7 of the block of thermoelectric cells is in contact with the heat source through a resilient connection means 6 whereas the side 8 of the thermoelectric cells is in contact with the outside casing forming the cold source through a resilient connecting element 10 analogous, by its structure, with the connecting element 6 and also formed by a layer of resilient resin basically consisting of silicone substances.

The outer upper face and the outer lower face of the platinum cylinder are surrounded with a very slight conductive substance 11 consisting of slightly resilient insulating microporous mineral product whose consistency is similar to a mixture of felt and chalk. That insulating product is formed essentially by agglomerated granulated silica. That product is degassed for a long while and placed under partial pressure in the order of 100 torrs of Xenon or of any other heavy, that is, highly insulating, gas. The assembly is placed in an outer enclosure 12 made of stainless steel or titanium and fixed on a base 13 thermally connected to the casing 12. Two output wires 14 and 15 of the thermoelectric element and a metallic vacuum tube 16 pass through that base.

The outer casing 12 is made of two parts welded by electronic bombardment along a circumference 17 placed above the upper part of the platinum cylinder 4. That casing is polished on the inside.

In order to compensate the slow increase in the pressure which may occur during the long service period of the generator inside the enclosure 12 subsequent to insufficient degassing of the heat insulator 11, a metallic grid 18 coated with a getter paste such a Titanium-Zirconium compound which is heated by conductivity after pumping and closing of the vacuum pipe 16 is placed at the top of that enclosure 12.

The installing of the thermocouples leads to a certain number of preparatory operations.

The block of thermoelectric couples is formed by a known method. It comprises elements basically consisting of bismuth telluride at high density in the order of 500 elements per squ. cm. connected up in series. The P elements are produced from a solid solution of bismuth telluride and antimony telluride doped with lead. The N elements are produced from a solid solution of bismuth telluride and bismuth selenide highly doped with metallic halides.

When the connections between the elements are produced, the lateral faces of the thermoelectric block 5 are coated with a resin known by the trade name "Araldite". The output wires are installed. A second lateral coating is formed with an epoxy resin, this being followed by accurate dimensioning; on the outside, the epoxy layer is covered with a thin reflecting layer. The gap in the order of 4/10 mm on either side of the thermoelectric block is filled with a resilient resin basically consisting of silicone substances, possibly charged with a powder of a conductive metal such as aluminum, copper or silver.

It is a fact that bismuth telluride is capable of forming an alloy with platinum. In the case where the bearer of such a microgenerator is burnt in a fire, the bismuth telluride will be liable to come into contact with the platinum, and this would cause the destruction of the outer covering of the heat source; an oxidation of the tantalum covering could occur, setting free the plutonium 238. The chances of such an occurrence are reduced by depositing on the whole of the platinum cylinder a diffusion barrier formed by a thin layer of alumina, zirconium or boron nitride.

The radioactive source supplies substantially 80 mW of power in the form of heat through a platinum casing brought to 60°C. More than half that power is recuperated by the thermocouple. The difference in temperature between the heat source and the elements of the block of thermoelectric couples is in the order of 1°C. It will therefore be seen that the resilient connecting element, while providing a resilient connection between the mass formed by the heat source and the outer casing 12 does not cause an excessive consumption of energy.

Moreover, by way of experiment, it was possible to submit such microgenerators to very high accelerations reaching 1000 g. The mechanical connection between the thermoelectric generator and the two sources has proved to be sufficiently resilient and flexible for no damage to the device to occur.

In a certain number of microgenerators, the heat insulation of the heat source on the top and lateral faces which are not in contact with the thermoelectric assembly has been improved by arranging an extra enclosure above the well 4 and at a very slight distance from the latter, in the order of 0.5 mm. That extra enclosure has been polished on the inside and the space comprised between that enclosure and the wall 4 has been brought to a vacuum in the order of $10^{-5}$ Torr. Thus, the resistance of the medium surrounding the hot wall outside the space leading to the thermoelectric couple is greatly increased without, however, reducing the solidity and hence the reliability of the microgenerator. Indeed, in the case of very great acceleration, subsequent to the elasticity of the layers 7 and 8, the casing of the heat source will come into contact with that extra enclosure, but deformation will be attenuated by the insulating mass 11 surrounding that enclosure and the heat source will resume its original position when the acceleration has come to an end. The remarkable increase in the resistance of the medium surrounding the heat source enables better draining of the heat produced towards the thermocouple and very appreciable increase in the output of the source.

Although the device which has just been described appears to afford the greatest advantages for implementing the invention, it will easily be understood that various modifications may be made thereto without going beyond the scope of the invention by putting into operation various equivalent means, more particularly inasmuch as concerns heat insulation of the heat source on all its faces which are not in contact with the thermocouple.

What I claim is:

1. A very long-lasting thermoelectric microgenerator comprising an outer casing acting as a cold source;
   a heat source disposed inside said outer casing and including a fluid-tight heat conducting metallic casing containing, in the vicinity of one of its walls, a radioactive source;
   a high output thermoelectric generator within said outer casing;
   said thermoelectric generator consisting of a plurality of P and N semiconductor elements connected in series;
   first means for mechanically and thermally connecting said thermoelectric generator to the heat source;
   second means for mechanically and thermally connecting said thermoelectric generator to the cold source; and
   a highly insulating medium filling in the rest of the space confined by the outer casing;
   said first and second means each comprising a layer of resilient resin, being electrically insulating and having a low heat resistance in relation to the resistance of said highly insulating medium confined by the external casing; and said highly insulating medium being a resilient microporous mineral substance which is a poor heat conductor, degassed vigorously, set in a rarefied heavy gas atmosphere.

2. A very long-lasting thermoelectric microgenerator according to claim 1, wherein said layers of resilient resin basically consist of silicone substances.

3. A very long-lasting thermoelectric microgenerator according to claim 2, wherein the P and N semiconductor elements in the thermoelectric generator comprise a solid bismuth telluride solution.

4. A very long-lasting thermoelectric microgenerator according to claim 3, wherein the P semiconductor elements in the thermoelectric generator include solid bismuth telluride and antimony telluride highly doped with lead.

5. A very long-lasting thermoelectric microgenerator according to claim 4, wherein the N semiconductors in the thermoelectric generator include solid solution of bismuth telluride and bismuth selenide highly doped with metallic halides.

6. A very long-lasting thermoelectric microgenerator according to claim 5, wherein the outer wall of the heat source is polished.

7. A very long-lasting thermoelectric microgenerator according to claim 6, wherein the inner wall of the outer enclosure of the microgenerator is polished.

8. A very long lasting thermoelectric microgenerator according to claim 2, wherein the heat source including the casing of said heat source completely covered with a very thin layer of alumina.

9. A very long-lasting thermoelectric microgenerator according to claim 2, wherein the casing of said heat source is completely covered with a layer of zirconium.

10. A very long-lasting thermoelectric microgenerator according to claim 2, wherein the casing of said heat source is completely covered with a layer of boron nitride.

11. A very long-lasting thermoelectric microgenerator according to claim 2, further including, at the upper part of the space between the outer wall of the heat source and the outer casing, a getter element.

12. A very long-lasting thermoelectric microgenerator according to claim 5, further including, at the upper part of the space between the outer wall of the heat source and the outer enclosure, a getter element.

13. A very long-lasting thermoelectric microgenerator according to claim 12, wherein the outer wall of the heat source is surrounded by an extra metallic wall polished on the inside and the space between the outer wall of the heat source and the extra metallic wall is kept under a very high vacuum.

14. A very long-lasting thermoelectric microgenerator comprising an outer casing acting as a cold source;
   a heat source disposed inside said outer casing and including a fluid-tight heat conducting metallic casing containing, in the vicinity of one of its walls, a radioactive source;
   a high output thermoelectric generator within said outer casing mechanically connected to the heat source and to the cold source;
   a highly insulating medium filling in the rest of the space confined by the outer casing;
   said highly insulating medium being resilient microporous mineral substance which is a poor heat conductor, degassed vigorously, set in a rarefied heavy gas atmosphere.

15. A very long-lasting thermoelectric microgenerator according to claim 14, wherein said high output thermoelectric generator is mechanically connected to the heat source and to the cold source with respective layers of resilient resin material.

16. A very long-lasting thermoelectric microgenerator comprising an outer casing acting as a cold source;
a heat source disposed inside said outer casing and including a fluid-tight heat conducting casing containing, in the vicinity of one of its walls, a radioactive source;
said conducting casing having an outer layer of Platinum;
a high output thermoelectric generator within said outer casing mechanically connected to the heat source and to the cold source;
said thermoelectric generator consisting of a plurality of P and N semiconductor elements connected in series and comprising a solid bismuth telluride solution;
a highly insulating medium filling in the rest of the space confined by the outer casing;
said outer layer of Platinum being completely covered with a very thin layer of boron nitride.

17. A very long-lasting thermoelectric microgenerator comprising an outer casing acting as a cold source;
a heat source disposed inside said outer casing and including a fluid-tight heat conducting casing containing, in the vicinity of one of its walls, a radioactive source;
said conductive casing having an outer layer of Platinum;
a high output thermoelectric generator within said outer casing mechanically connected to the heat source and to the cold source;
said thermoelectric generator consisting of a plurality of P and N semiconductor elements connected in series and comprising a solid bismuth telluride solution;
a highly insulating medium filling in the rest of the space confined by the outer casing;
said outer layer of Platinum being completely covered with a very thin layer of alumina.

18. A very long-lasting thermoelectric microgenerator comprising an outer casing acting as a cold source;
a heat source disposed inside said outer casing and including a fluid-tight heat conducting casing containing, in the vicinity of one of its walls, a radioactive source;
said conducting casing having an outer layer of Platinum;
a high output thermoelectric generator within said outer casing mechanically connected to the heat source and to the cold source;
said thermoelectric generator consisting of a plurality of P and N semiconductor elements connected in series and comprising a solid bismuth telluride solution;
a highly insulating medium filling in the rest of the space confined by the outer casing;
said outer layer of Platinum being completely covered with a very thin layer of zirconium.

19. A very long-lasting thermoelectric microgenerator according to claim 18, wherein the outer wall of the heat source is polished.

20. A very long-lasting thermoelectric microgenerator according to claim 19, wherein the inner wall of the outer enclosure of the microgenerator is polished.

21. A very long-lasting thermoelectric microgenerator according to claim 20, further including, at the upper part of the space comprised between the outer wall of the heat source and the outer enclosure a getter element.

* * * * *